Feb. 18, 1969 B. N. LOCANTHI 3,428,908
MULTI-STAGE, DIRECT-COUPLED TRANSISTOR AMPLIFIER
HAVING COMPLEMENTARY SYMMETRY
Filed Feb. 3, 1966
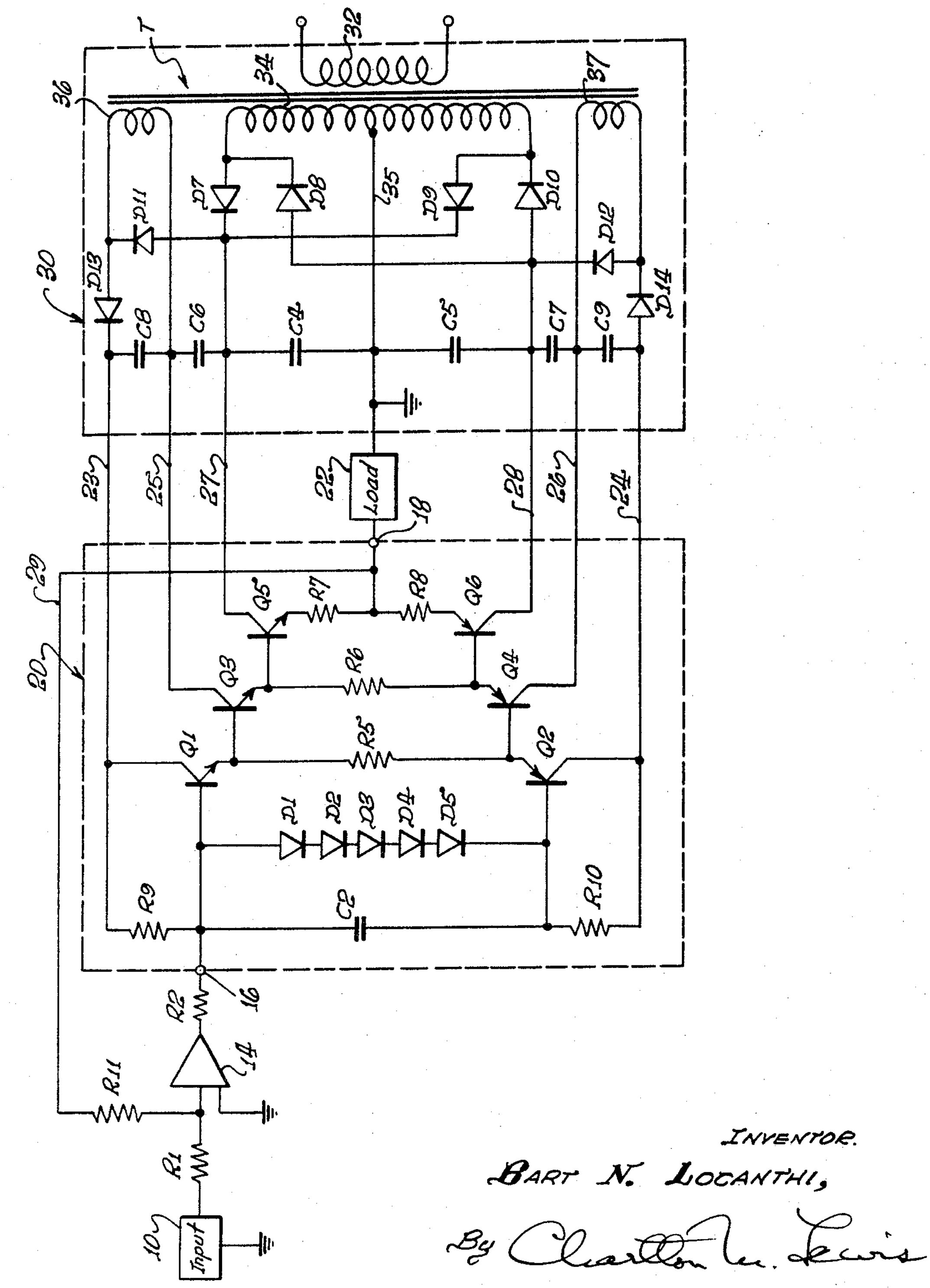
INVENTOR.
BART N. LOCANTHI,
By Charlton M. Lewis United States Patent Office 3,428,908
Patented Feb. 18, 1969

3,428,908

MULTI-STAGE, DIRECT-COUPLED TRANSISTOR AMPLIFIER HAVING COMPLEMENTARY SYMMETRY

Bart N. Locanthi, Altadena, Calif., assignor to James B. Lansing Sound, Inc., Los Angeles, Calif., a corporation of California Filed Feb. 3, 1966, Ser. No. 524,882
U.S. Cl. 330—13 6 Claims
Int. Cl. H03f 3/18

ABSTRACT OF THE DISCLOSURE

Each amplifier stage comprises two transistors of complementary symmetry with their emitters connected together through small biasing resistances, and with each emitter directly coupled to the base of the corresponding transistor of the following stage. Base-emitter bias for all transistors is provided by a string of diodes connected between the bases of the transistors of the first stage. Power is supplied from a center-tapped source directly to the collectors of the respective stages at voltages that are higher for preceding stages. The additional voltage supply for a preceding stage is obtained from additional secondary windings on the power transformer and additional rectifying circuits connected between the power terminals for the output stage and the collectors of the preceding stage.

This invention has to do with transistor amplifiers having a plurality of directly coupled stages and wherein each stage utilizes two transistors in complementary symmetry configuration.

One aspect of the invention permits the known advantages of emitter-follower operation to be combined with those of complementary configuration in a multi-stage, direct-coupled amplifier.

Another aspect of the invention provides a multi-stage, direct-coupled amplifier in which the coupling between adjacent stages is between transistors of the same symmetry type, rather than between transistors of opposite complementary symmetry type as in some previously available circuits.

A further aspect of the invention provides particularly effective and economical biasing circuitry for transistor amplifiers of the described type. In preferred form of such biasing means, the bias voltages for the transistors of all stages of the described type are derived from a single positively established voltage that is applied directly to the first stage. This biasing configuration facilitates accurate balance and smooth crossover in Class B operation. It also permits great economy and convenience of wiring, especially when utilizing, the known advantages of diodes for temperature compensated bias definition.

A further aspect of the invention provides remarkably low impedance paths for the collector leakage currents of all transistors, resulting in increased temperature stability as compared with previously available amplifiers with complementary symmetry.

The invention further permits unusually broad tolerance in selection of transistors of complementary type, affording the known general advantages of complementary symmetry without requiring perfect matching of the transistors of each pair.

Another aspect of the invention provides each stage of the amplifier with power at the most efficient voltage level, furnishing individual voltages to the respective stages from a power supply system of particularly simple and economical type. The resulting increased power efficiency results in marked economy of production, reduction of heating and similar advantages.

The invention is especially useful in connection with output or power stages of amplification. The remarkably low distortion that can be provided by the invention and the ability to handle direct current signal components make the invention highly useful in the field of operational amplifiers. Amplifiers in accordance with the invention are also highly advantageous for high fidelity amplification, being well adapted for directly driving a loudspeaker system.

The accompanying figure is a schematic drawing representing an illustrative amplifier and power supply in accordance with the present invention.

As illustrated, the amplifier of the figure receives an input signal from any desired source, indicated schematically at 10. Source 10 may represent an audio or other transducer, a radio or television device, an analogue computer, or any other source of electrical signals to be amplified. The signal from source 10 is delivered via the summing resistance R1 to the driving amplifier 14, which is typically of conventional design and is shown only schematically. Amplifier 14 may include several stages of amplification and may employ any desired type of coupling, direct or otherwise, between its stages and at its input and output. A preferred type of amplifier for use at 14 includes two stages, each comprising a differential amplifier. The amplified signal from driving amplifier 14 is supplied via the resistance R2 and the input terminal 16 to the amplifier 20 in which, with its power supply 30, the present invention is more particularly embodied. The output from amplifier 20 is delivered at the output terminal 18. In the present embodiment both the input at 16 and the output at 18 are referenced to ground potential, and the load, indicated schematically at 22, is connected directly between output terminal 18 and that illustrative reference potential. A potential different from ground may be employed as reference potential if desired. However, throughout the present description the reference potential will generally be referred to as ground potential for the sake of definiteness and without intending to imply any limitation. Although both input and output are of single-ended type, all three stages of amplifier 20 have many of the attributes normally associated with push-pull amplification.

The present amplifier is preferably provided with a negative feedback circuit, which may be of conventional type. As illustrated, an overall feedback connection is provided via the line 29 from output terminal 18 to the input of driving amplifier 14, which is assumed to invert the polarity of the input signal. The series resistance R11 in feedback line 29 may be considered to form a summing network with resistance R1, or may be considered to represent a filter network of any desired type which may be associated with the feedback circuit in conventonal manner.

Amplifier 20 is illustratively shown as a three-stage amplifier. It will be seen at once, however, that additional stages can be added at will, with suitable adjustment of components, and that the middle stage of the present amplifier can be omitted without altering the basic principles of operation.

Each of the three stages of amplifier 20 comprises one transistor of npn type and one transistor of pnp type, having their emitters connected together via an impedance shown as a simple resistance; and having their collectors supplied with power of suitable polarity. The first stage comprises the npn transistor Q1 and the pnp transistor Q2, with their emitters connected via the resistance R5 and their collectors supplied via the leads 23 and 24 with electrical power at positive and negative voltages, respectively, with respect to ground. The second stage similarly comprises the transistors Q3 and Q4 interconnected via the resistance R6 and supplied with positive and negative power via the leads 25 and 26. The output stage comprises the transistors Q5 and Q6, with their emitters interconnected by the two equal series connected resistances R7 and R8 and supplied with positive and negative power via the leads 27 and 28. The respective stages are coupled by direct connection of the emitter of each transistor in a preceding stage to the base of the transistor of the same symmetry type in the following stage. Output terminal 18 is directly connected to the junction of resistances R7 and R8. A protective impedance may be inserted in series with the output terminal if desired.

Preferred means will be described for providing power at appropriate respective voltages to the leads 23 through 28 to obtain improved performance and economy. However, many important advantages of the present invention are obtainable with the three positive power leads 23, 25 and 27 connected to a common source of positive power and the three negative leads 24, 26 and 28 connected to a common source of negative power.

The emitter resistances R5 and R6, and to a lesser extent R7 and R8, perform an important biasing function in addition to other advantages to be described. The present amplifier 20 includes also bias generating circuitry which is connected at the input to the first stage. That circuitry performs the function of maintaining a desired bias potential between the bases of the transistors Q1 and Q2 of the first stage of the power amplifier. The proper bias for each of the six transistors Q1 to Q6 is derived from that single bias potential by the circuitry already described. That derivation is performed primarily by the emitter resistances and comprises essentially a division of the initially determined bias potential into six parts. In other words, the bias potential applied between the bases of Q1 and Q2 is substantially equal to the sum of the desired base-emitter biases for all six transistors. Thus, the bias potentials for both pnp and npn transistors of all stages are derived from a single applied bias potential.

The drawing represents preferred circuit means for maintaining the proper value of the total bias potential at the input to the first stage of the amplifier. That circuit means comprises the string of series connected diodes D1 through D5, connected directly between the bases of transistors Q1 and Q2, and power connections via the resistances R9 and R10 from the respective power lines 23 and 24 for maintaining a small forward current in those diodes. That current establishes a definite total bias potential between the bases of Q1 and Q2, determined by the number of diodes in the string and by selection of the diode type. Diodes D1 to D5 are preferably shunted by the capacitance C2, providing a low impedance path between the two transistor bases for signal components of high frequency. Bias diodes D1 to D5 are preferably selected to have temperature characteristics suitably related to the temperature characteristics of transistors Q1 to Q6, particularly with respect to their base-emitter "contact" potentials. The diodes are preferably mounted in close thermal contact with the same heat sink by which the transistor temperatures are controlled.

In the usual case of Class B operation, the total bias potential and the emitter resistances R5 to R8 are so selected that under conditions of zero input signal all transistors are held close to cutoff, but with a small current through them which is adjusted to provide optimum smoothness of transition between positive and negative signal swings. In equilibrium at zero signal, the voltage drop in R5 plus the base-emitter biases of both transistors Q1 and Q2 equals the total drop across the diode string. The higher the value of R5 the smaller the bias potentials and the equilibrium current, and the closer to cut-off those transistors are held. The voltage drop across R5 is applied directly between the bases of transistors Q3 and Q4 of the next stage. The equilibrium current through the latter transistors is similarly determined by the value of R6. The voltage standing across R6 is applied in turn between the bases of the last stage transistors Q5 and Q6. That voltage is divided between effective base-emitter bias voltages at those transistors and voltage drop in R7 and R8. The circuit can operate effectively with the latter resistors equal to zero, but it is preferred to maintain a small resistance between the emitters of the output stage. Such resistance has been found to yield a smoother crossover under Class B operation and to permit highly satisfactory operation even when the two complementary transistors of the final stage are not perfectly matched. The latter advantage not only facilitates initial production and potential replacement of components, but even may permit effective use under some conditions of one silicon and one germanium transistor in the final stage. Resistances R5 and R6, though playing a major role in the proper distribution of the bias potentials, also perform a useful action in smoothing the crossover between transistors and in greatly easing the required tolerance with which the complementary transistors of each pair are matched.

The number of bias diodes D1 to D5 is not necessarily equal to the total number of transistors, but corresponds to the latter number in the sense that the voltage drop across the string of diodes provides the desired total bias voltage for all transistors. In preferred practice, that voltage drop exceeds the sum of all transistor biases by the relatively small voltage drop standing across R7 and R8 under zero signal condition of the circuit. The latter voltage is typically of the same order as the bias supplied to each transistor.

In presence of a positive-going signal, for example, at input terminal 16, the bias diodes and C2 cause the potential to rise substantially equally at the bases of both transistors Q1 and Q2. The zero signal current through Q1 is thereby increased and that through Q2 decreased. However, both those changes are small, the current through R5 and the resulting voltage across it remaining essentially unchanged. Substantially the entire signal voltage is thus supplied to the base of second stage transistor Q3, and a somewhat smaller signal voltage of the same polarity is applied to the base of Q4. That stage acts in similar manner to transmit the signal voltage with gain of nearly unity to the output stage. The resulting increased current through output transistor Q5 flows through R7 and load impedance 22 to ground. That load current increases in accurate proportion to the positive-going input signal at 16, the voltage level of Q1, Q3 and Q5 rising essentially uniformly except for the progressively increasing voltage drops at the respective transistors due to their internal resistances. Essentially the entire current through Q1 and Q3 is available for driving the next following transistors. Meanwhile the inactive transistors Q2, Q4 and Q6 transmit decreasing but normally still finite currents across collector-emitter potentials that increase progressively with the signal. With a negative-going input signal the action is similar, except that the PNP transistors are active, Q6 drawing current through load 22 from ground to negative terminal 28.

The emitter follower type of circuit is inherently capable of being driven with good linearity to a maximum amplitude at which the emitters are virtually at the full supply voltage, less only the relatively small voltage drop due to the collector-emitter resistance of the fully conductive transistor. However, to drive the transistor to that full amplitude the base must be driven with somewhat greater amplitude to maintain maximum conductivity of the transistor at peak power. In accordance with the present invention, that is accomplished by providing each stage of the present amplifier with its own independently selected power supply. The supply voltage can then be higher for each forward stage than for the next following stage. Since the current drawn by the forward stages is small compared to that of the output stages a power supply of relatively small power rating is entirely adequate for the former. The present drawing illustrates at 30 a particularly convenient and economical manner of producing adequate power at appropriate voltages for the respective stages of amplifier 20.

The single power transformer T has a primary winding 32 supplied with alternating current power, typically at 115 volts and 60 cycles. The main secondary winding 34 has a center tap which is grounded via the line 35. The ends of winding 34 are connected via the diodes D7 through D10 in full-wave rectifying configuration to the power lines 27 and 28. Conventional filtering of the power output is provided, as indicated by the shunt capacitances C4 and C5. Main winding 34 is designed to maintain lines 27 and 28 at the desired supply voltages +V and −V for the output stage of the amplifier, which draws appreciable current under peak signal conditions.

Transformer T is also provided with two auxiliary windings 36 and 37 which are electrically isolated from 34. The high voltage terminals of windings 36 and 37 are connected to main power lines 27 and 28, respectively, via the diodes D11 and D12. Those diodes act as half-wave rectifiers to maintain the auxiliary windings at an average potential relative to the main windings terminals that is elevated by the voltage developed across each auxiliary winding, say V1. Those elevated potentials $V+V1$ are supplied from the inner terminals of the auxiliary windings to the second stage power lines 25 and 26, respectively. The diodes D13 and D14 further provide half-wave rectification of V1 to supply voltages of absolute magnitude $V+2V1$ to the power lines 23 and 24 for the forward stage of amplifications. The auxiliary power supplies are suitably filtered, as indicated by the shunt capacitances C6 through C9.

It will be noted that a large fraction of the power for supply to the forward two stages is derived from main secondary winding 34, and only that portion providing the increased voltage is drawn from the auxiliary windings. Hence the latter windings and also the associated rectifying diodes and filter components can have correspondingly low ratings, leading to considerable economy of construction. Optimum power economy is obtained by drawing power for each stage from a source of voltage no higher than is needed to handle peak signals.

An important advantage of the present invention is the relatively low impedance path that is provided for leakage current flowing between collector and base of the transistors of both symmetry types. Such leakage current in NPN transistor Q3, for example, flows through R5 and then to power line 24 via the emitter-collector circuit of the complementary transistor Q2 of the next preceding stage. When transistor Q3 is cut off Q2 is normally conductive, so that the described current path has low resistance during the portion of each signal cycle when the leakage current in Q3 might present the most serious problem. Similarly, leakage current in PNP transistor Q4 is drawn from power supply line 23 via the complementary transistor Q1 of the preceding stage and through resistance R5. Leakage current in output transistors Q5 and Q6 is accommodated in similar manner by R6 and the transistors of the preceding stage. The collector leakage current in first stage transistors Q1 and Q2 is accommodated in more conventional manner by the biasing circuitry already described, passing through bias diodes D1 to D5 and through either R9 or R10.

It may be noted, in view of the inherent symmetry of the described amplifier circuit, that the input signal from driving amplifier 14 can be applied directly to the base of either first stage transistor Q1 or Q2, and will be transmitted to the other input transistor by the biasing circuit. If direct coupling is desired between the output of driving amplifier 14 and the input of amplifier 20, as indicated, the design of amplifier 14 must provide an output referenced to a suitable voltage offset from ground by substantially half of the total bias voltage developed across the diode string D1 to D5.

As an example of the practical carrying out of the invention, the following component values may be utilized successfully in a circuit of the general configuration shown in the present figure, and are given merely for illustration: Q1 and Q2, silicon transistors, Motorola types MM2258 and SS3634, maximum power rating 5 watts; Q3 and Q4, silicon transistors, types 2N3766 and 2N3740, power rating 20 watts; Q5 and Q6, silicon transistors, types 2N3715 and 2N3791, power rating 150 watts; R5, 1000 ohms; R6, 60 ohms; R7 and R8, 0.4 ohm; D1 to D5, silicon diodes, type 1N816; C2, 100 microfarads. With such illustrative components, appropriate supply voltages to the transistor collectors are typically plus and minus 50 volts to Q1 and Q2, plus and minus 45 volts to Q3 and Q4, and plus and minus 40 volts to Q5 and Q6.

It will be evident to those skilled in the art that many changes can be made in the particular illustrative structure that has been shown without departing from the proper scope of the present invention.

I claim:

1. A multi-stage, direct-coupled transistor amplifier comprising in combination:
- an ordered plurality of pairs of transistors of complementary types,
- conductive circuit means interconnecting the emitters of the transistors of each pair,
- power means for supplying to the collectors of the transistors of the respective types voltages of opposite polarity with respect to the reference terminal,
- conductive circuit means connecting the emitter of each transistor of a preceding pair of the base of the corresponding transistor of the next following pair,
- bias circuit means for supplying base-emitter operating bias voltages to the transistors and comprising a string of series connected diodes connected between the bases of the transistors of the first pair, and circuit means for producing forward current in the diodes, the number of said diodes corresponding to the total number of said transistors,
- means for supplying a signal to the bases of the transistors of the first pair,
- and means for connecting a load between the reference terminal and the emitters of the both transistors of the last pair.

2. A multi-stage, direct-coupled transistor amplifier comprising in combination:
- an ordered plurality of pairs of transistors of complementary types,
- conductive circuit means interconnecting the emitters of the transistors of each pair and including series resistance means,
- said series resistance means for the last pair of transistors having a resistance value such that at zero signal the collector-emitter current in the transistors of the last pair produces a voltage drop therein of the same order of magnitude as the sum of the base-emitter biases of those transistors,
- power means for supplying to the collectors of the transistors of the respective types voltages of opposite polarity with respect to a reference terminal,
- conductive circuit means connecting the emitter of each transistor of a preceding pair to the base of the corresponding transistor of the next following pair,
- bias circuit means for supplying operating bias voltages to the transistors,
- means for supplying a signal to the bases of the transistors of the first pair,
- and means for connecting a load between the reference terminal and the emitters of both transistors of the last pair.

3. A multi-stage, direct-coupled transistor amplifier comprising in combination:
- an ordered plurality of pairs of transistors of complementary types,
- conductive circuit means interconnecting the emitters of the transistors of each pair,
- power means for supplying to the collectors of the transistors of the respective types voltages of opposite polarity with respect to a reference terminal, the absolute values of the voltages supplied to the transistor collectors being higher for a preceding pair of transistors than for the next following pair of transistors, conductive circuit means connecting the emitter of each transistor of a preceding pair to the base of the corresponding transistor of the next following pair, bias circuit means for supplying operating bias voltages to the transistors, means for supplying a signal to the bases of the transistors of the first pair, and means for connecting a load between the reference terminal and the emitters of both transistors of the last pair.

4. A transistor amplifier as defined in claim 3, and wherein said power supply means comprise a transformer having a primary winding, main secondary winding means with a center tap connected to said reference terminal, and two auxiliary winding means, main rectifying means connected to the main secondary winding means for supplying main positive and negative voltages to respective output terminals, circuit means connecting the main output terminals to the collectors of the respective transistors of the last stage, auxiliary rectifying means connected to the respective auxiliary winding means for producing positive and negative auxiliary voltages, and circuit means for supplying the auxiliary voltages between the main output terminals and the collectors of the respective transistors of a preceding stage in polarity to provide the preceding stage with power at a total voltage higher than the main voltage.

5. In combination with a multi-stage, direct-coupled transistor amplifier in which each stage includes at least one transistor connected in emitter follower configuration, power supply means comprising power terminal means connected to the transistor collectors of each stage, main power means for supplying power at a main voltage to the power terminal means of the last stage, and auxiliary power means for supplying power at an auxiliary voltage, the output of the auxiliary power means being connected between the power terminal means of the last stage and the power terminal means of a preceding stage in polarity to provide the preceding stage with power at a total voltage higher than the main voltage.

6. In combination with a multi-stage, direct-coupled transistor amplifier with two transistors of complementary type in each stage connected in emitter follower configuration, power supply means comprising a transformer having a primary winding, main secondary winding means with a center tap connected to a reference potential, and two auxiliary winding means, main rectifying means for deriving main positive and negative voltages from the main secondary winding means for supplying to respective main output terminals, auxiliary rectifying means for deriving auxiliary positive and negative voltages from the respective auxiliary winding means, circuit means connecting the main output terminals to the collectors of the respective transistors of the last stage, and circuit means for supplying the auxiliary voltages between the main output terminals and the collectors of the respective transistors of a preceding stage in polarity to provide the preceding stage with power at a total voltage higher than the main voltage.

References Cited

UNITED STATES PATENTS

| | | | |
|---|---|---|---|
| 2,847,519 | 8/1958 | Aronson | 330—13 |
| 2,994,834 | 8/1961 | Jones | 330—13 X |
| 3,375,455 | 3/1968 | Motta | 330—17 X |

JOHN KOMINSKI, *Primary Examiner.*

SIEGFRIED H. GRIMM, *Assistant Examiner.*

U.S. Cl. X.R.

307—313; 330—17, 18, 19, 22, 24, 40

PO-1050
(5/69)

UNITED STATES PATENT OFFICE
CERTIFICATE OF CORRECTION

Patent No. 3,428,908 Dated February 18, 1969

Inventor(s) Bart N. Locanthi

It is certified that error appears in the above-identified patent and that said Letters Patent are hereby corrected as shown below:

Column 6, line 27, cancel "the" and substitute --a--;

line 29, cancel "of," second occurrence, and substitute --to--

SIGNED AND
SEALED
NOV 4 1969

(SEAL)
Attest:

Edward M. Fletcher, Jr.
Attesting Officer

WILLIAM E. SCHUYLER, JR.
Commissioner of Patents